(12) United States Patent
Lee

(10) Patent No.: US 6,712,129 B1
(45) Date of Patent: Mar. 30, 2004

(54) HEAT DISSIPATION DEVICE COMPRISED OF MULTIPLE HEAT SINKS

(75) Inventor: Kuo-Shao Lee, Taipei (TW)

(73) Assignee: Taiwan TriGem Information Co., Ltd., Taipei (TW)

( * ) Notice: Subject to any disclaimer, the term of this patent is extended or adjusted under 35 U.S.C. 154(b) by 0 days.

(21) Appl. No.: 10/283,969

(22) Filed: Oct. 29, 2002

(51) Int. Cl.$^7$ ............................................... F28D 15/00
(52) U.S. Cl. ........................... 165/104.21; 165/104.33; 165/80.3; 361/700; 174/15.2
(58) Field of Search ..................... 165/80.3, 104.21, 165/104.33, 122, 185, 104.26; 361/699, 700; 257/715; 174/15.2

(56) References Cited

U.S. PATENT DOCUMENTS

| | | | | |
|---|---|---|---|---|
| 4,204,246 A | * | 5/1980 | Arii et al. ................... | 361/699 |
| 5,229,915 A | * | 7/1993 | Ishibashi et al. ............ | 361/699 |
| 5,959,837 A | * | 9/1999 | Yu .............................. | 361/697 |
| 6,062,299 A | * | 5/2000 | Choo et al. ................... | 165/46 |
| 6,105,662 A | * | 8/2000 | Suzuki .................. | 165/104.33 |
| 6,437,982 B1 | * | 8/2002 | Cardenas .................... | 361/700 |
| 6,487,076 B1 | * | 11/2002 | Wang ......................... | 361/697 |
| 6,600,649 B1 | * | 7/2003 | Tsai et al. ................... | 361/697 |
| 2003/0002252 A1 | * | 1/2003 | Pokhama et al. ........... | 361/687 |
| 2003/0039096 A1 | * | 2/2003 | Sheu .......................... | 361/687 |

* cited by examiner

*Primary Examiner*—Terrell McKinnon

(57) ABSTRACT

A heat dissipation device includes a multiple heat sink structure for enhanced heat removal. The multiple heat sin structure includes a contact pad positionable on a heat generating device, such as a central processing unit, and two heat sinks arranged on opposite sides of the contact pad and each directly and thermally coupled to the contact pad by heat pipes. A number of heat-radiating fins are attached or formed on each heat sink. Fans are coupled to the heat sinks by dir passages for providing air stream to induce forced convection.

19 Claims, 6 Drawing Sheets

HEAT DISSIPATION DEVICE COMPRISED OF MULTIPLE HEAT SINKS

FIELD OF THE INVENTION

The present invention relates generally to a heat dissipation device for removing heat from a heat generating device, such as an electronic device that generates heat during operation thereof, and in particular to a heat dissipation device comprised of a multiple heat sink structure for efficiently removing heat from the heat generating device and effectively maintaining normal operation temperature of the device.

BACKGROUND OF THE INVENTION

A lot of electronic devices, such as central processing units, generate heat when they are in operation. Such heat must be timely removed otherwise the electronic device malfunctions due to improper high temperature caused by the heat. A variety of heat dissipation devices are available in different forms, among which a heat sink that comprises a base for positioning on and in physical engagement with the electronic device and a number of spaced fins extending from the base is one of most common ones.

With the trend of minimization, the overall size of electronic devices is increasingly reduced. The heat sink that is positioned on the electronic device for physical engagement with the electronic device substantially increases the height of the electronic device. Thus, heat sinks that are positioned remotely from the electronic device and that are thermally coupled to the electronic device by heat pipes are known. In this case, the heat sink is positioned at substantially the same plane of the electronic device, no longer being stacked on the electronic device. This saves the space above the electronic device required for the stacking type heat sink.

On the other hand, once the amount of heat removed per unit time by the heat sink reaches the limit of the capacity of the heat sink, the temperature of the electronic device still rises, eventually causing malfunction of the electronic device. It is known to add an extra heat sink in cascade to the original heat sink for enhanced heat removal rate. This is not efficient in effectively reducing temperature of the electronic device.

SUMMARY OF THE INVENTION

Thus, an object of the present invention is to provide a heat dissipation device comprised of a multiple heat sink structure for enhancing heat removal rate.

Another object of the present invention is to provide a heat dissipation device comprised of two and more heat sinks thermally coupled to an electronic device in a parallel manner for efficiently removing heat from the electronic device.

A further object of the present invention is to provide a heat dissipation device comprised of a multiple heat sink structure which includes a forced convection fan system for inducing forced convection to further enhance heat removal rate.

To achieve the above objects, in accordance with the present invention, there is provided a heat dissipation device comprised of a multiple beat sink structure comprising a contact pad positionable on a heat generating device, such as a central processing unit, and at least two heat sinks arranged on opposite sides of the contact pad and each directly and thermally coupled to the contact pad by heat pipes. Many heat-radiating fins are attached or formed on each heat sink. Fans are coupled to the heat sinks by air passages for providing air stream to induce forced convection.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE INVENTION

Figure 1:
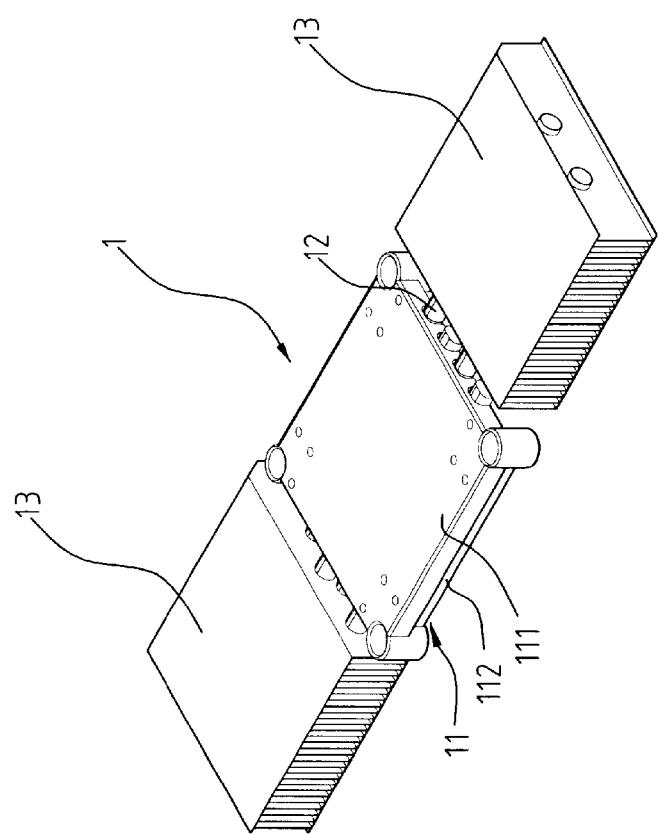
FIG. 1 is a perspective view of a heat dissipation device constructed in accordance with a first embodiment of the present invention.
Figure 2:
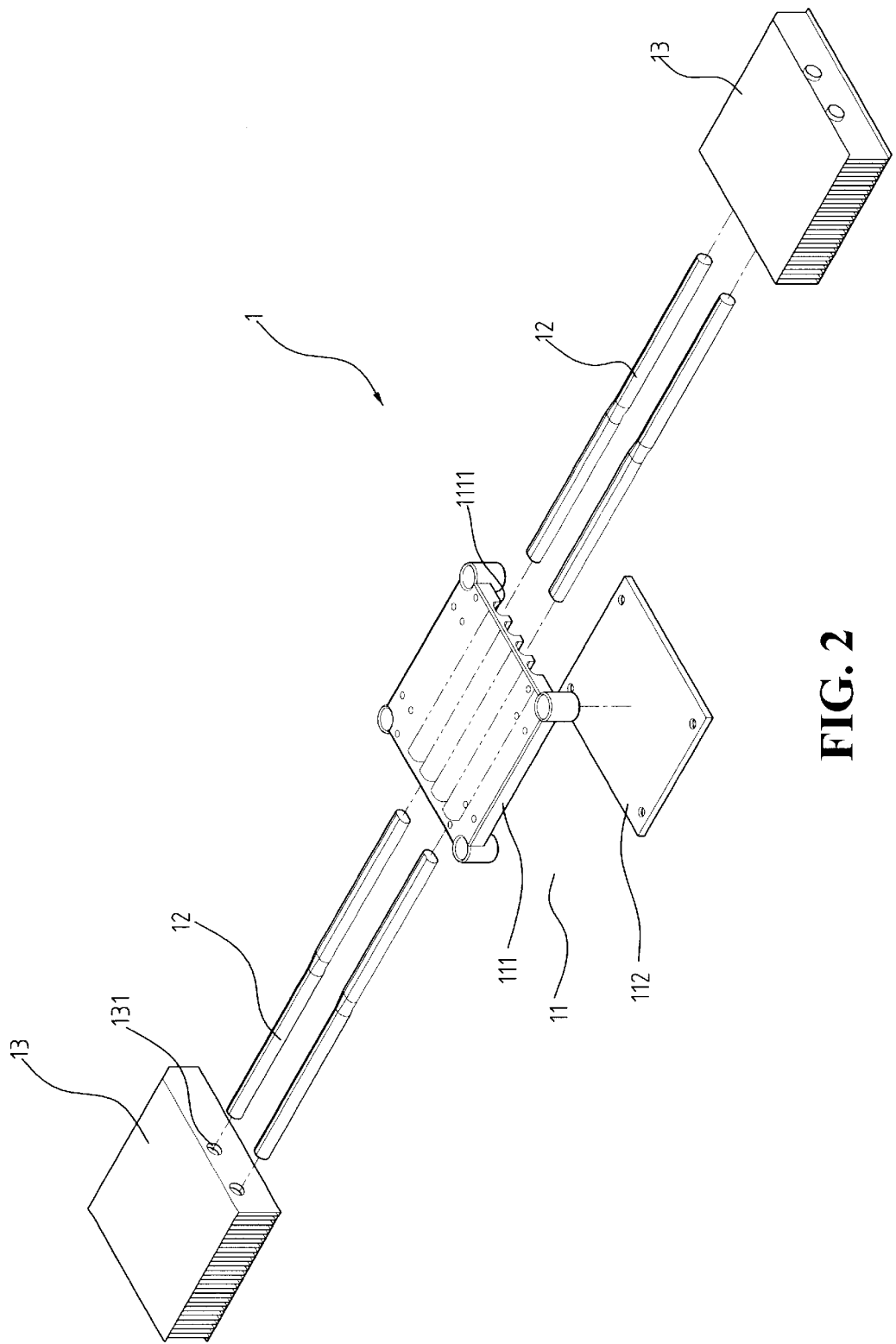
FIG. 2 is an exploded view of FIG. 1.

With reference to the drawings and in particular to FIGS. 1 and 2, a heat dissipation device constructed in accordance with a first embodiment of the present invention, generally designated with reference numeral 1, comprised a multiple heat sink structure comprising a contact pad 11 and two heat sinks 13 arranged on opposite sides of and spaced from the contact pad 11. Many heat-radiating fins are attached or formed on each heat sink. Alternatively, the heat sinks 13 may be positioned in correspondence to adjacent sides of the contact pad 11. In case three heat sinks are employed, the first and second heat sinks are positioned on opposite sides of the contact pad 11 and the third one may be arranged on a side of the contact pad 11 between the opposite sides to which the first and second heat sinks are connected. Heat pipes 12 extend between and physically engage the contact pad 11 and each heat sink 13 for transfer of heat from the contact pad 11 to the heat sinks 13. Thus, the heat sinks 13 are thermally coupled to the contact pad 11 in a parallel manner, rather than in cascade. Additional heat sinks may also be coupled to the contact pad 11 in thermally parallel to the heat sinks 13 to enhance beat removal.

The contact pad 11 comprises a lower or base board 112 positionable on an electronic device 3 (see FIG. 4), such as a central processing unit, that generates heat during operation thereof for conduction of heat from the electronic device 3. Thus, the base board 112 is made of a material of excellent thermal conduction, such as copper-based material. An upper or cover board 111 is mounted to the base board 112. The cover board 111 defines a plurality of channels 1111 for accommodating therein the heat pipes 12 thereby securing the heat pipes to the base board 112. The channels 1111 are formed in a lower surface of the cover board 111 whereby when the cover board 111 is mounted to the base board 112, the heat pipes 12 are securely retained between the cover board 111 and the base board 112. The channels 1111 are sized to snugly receive the heat pipes 12 therein and form physical engagement with the heat pipes 12. Both the cover board 111 and the base board 112 are made of heat conductive material whereby heat generated in the electronic device 3 is conducted through the contact pad 11 and transferred to the heat pipes 12.

Each heat sink 13 comprises a number of spaced fins (not labeled) in which aligned holes 131 are defined for receivingly engaging the heat pipes 12 thereby receiving heat that is transferred through the heat pipes 12.

By arranging the two heat sinks 13 on opposite sides of the contact pad 11 and directly and thermally coupling each heat sink 13 to the contact pad 11, heat transferred from the electronic device 3 to the contact pad 11 can be evenly and efficiently distribute to both heat sinks 13 thereby enhancing heat removal rate of the electronic device 3.

Figure 3:
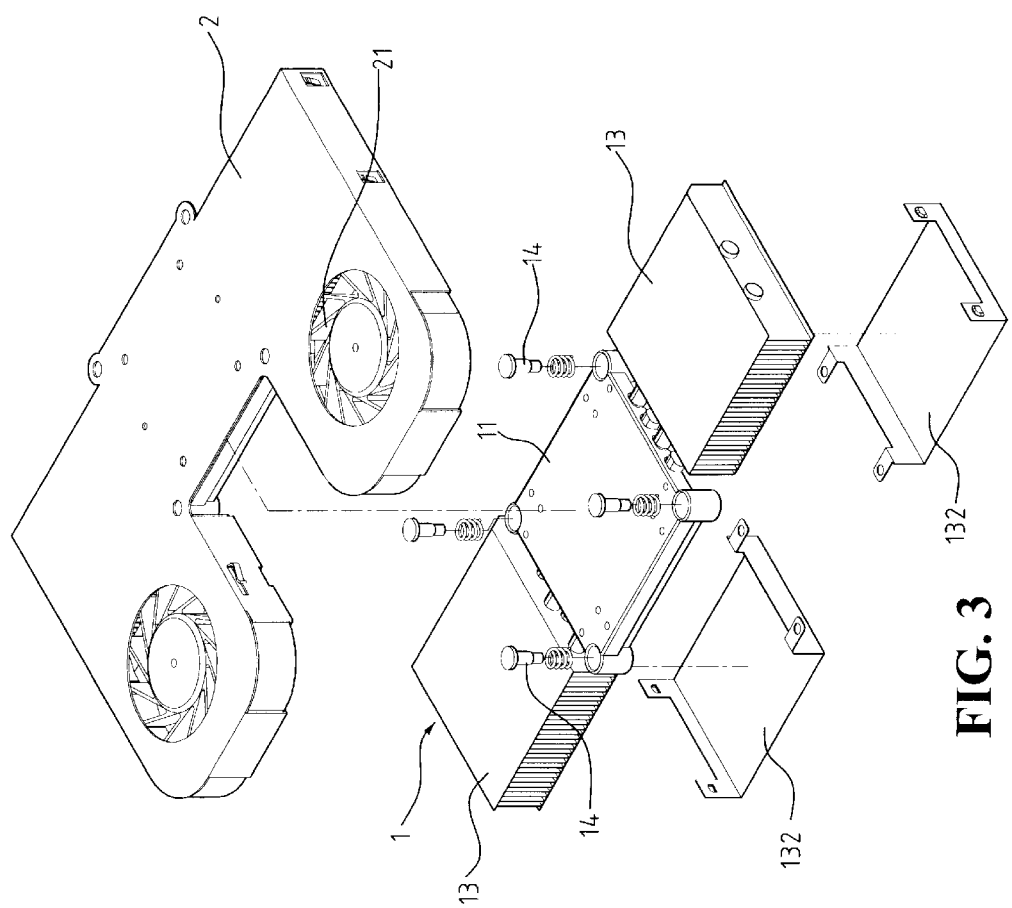
FIG. 3 is an exploded view of a heat dissipation device constructed in accordance with a second embodiment of the present invention.
Figure 4:
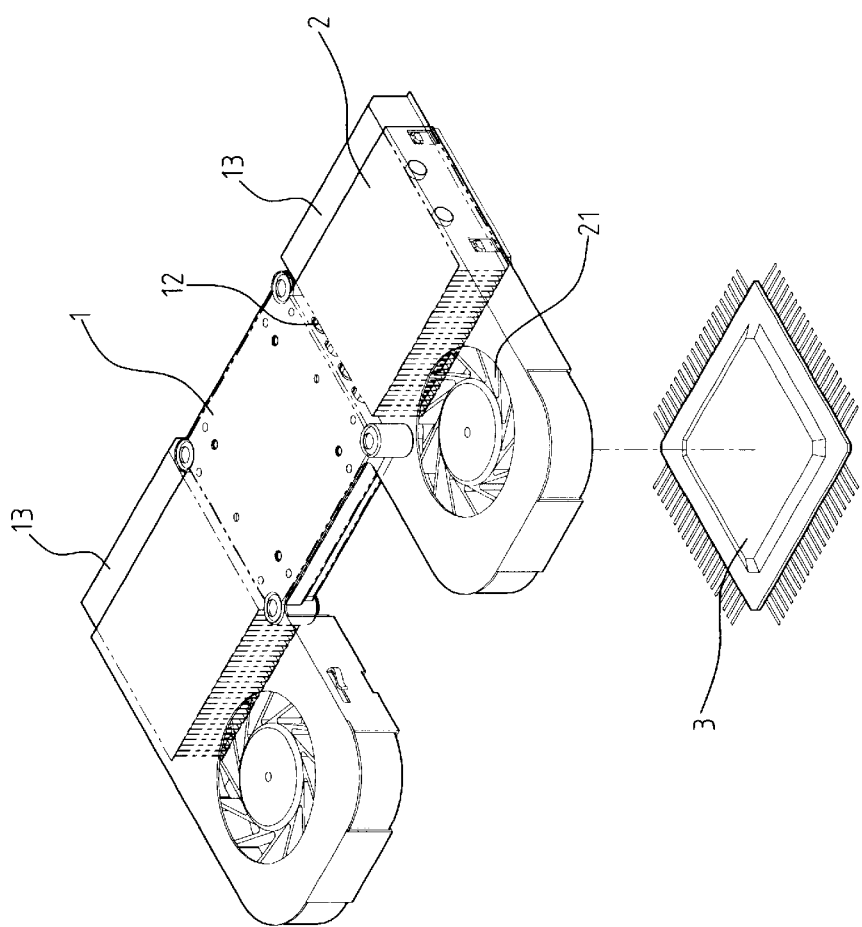
FIG. 4 is an assembled view of the heat dissipation device to be mounted to an electronic device.

FIGS. 3 and 4 show a heat dissipation device in accordance with a second embodiment of the present invention, which is a forced convection version of the first embodiment with reference to FIGS. 1 and 2. Beside the multiple heat sink structure disclosed in FIGS. 1 and 2, the heat dissipation device of the second embodiment additionally comprises an air stream generation system or a fan assembly comprising a top shell 2 mounted to the multiple heat sink structure 1 by spring-biased fasteners 14. Two fans 21 are arranged next to the heat sinks 13 and are supported by the top shell 2. The top shell 2 forms air passages (not labeled) between the fans 21 and the heat sinks 13 whereby air streams generated by the fans 21 are respectively guided toward the heat sinks 13 and flowing through the spacing between the fins of the heat sinks 13, inducing a forced convection to more efficiently transfer heat from the heat sinks 13 to the surroundings.

Bottom shells 132 are mounted to the bottom side of the heat sinks 13 to secure the heat sinks to the top shell 2 and to complete the formation of the air passages that lead to the heat sinks 13.

Figure 5:
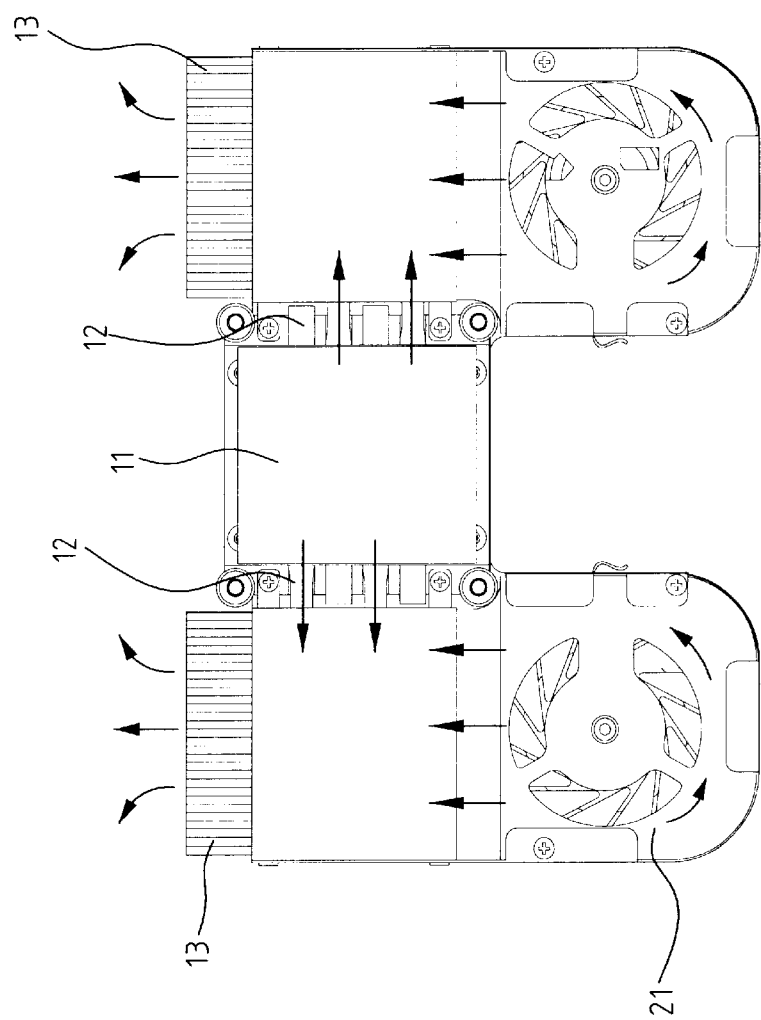
FIG. 5 is a top plan view of the heat dissipation device of the second embodiment of the present invention.

Also referring to FIG. 5, air streams that are generated by the fans 21 are conducted by the air passages formed by the top and bottom shells 2 and 132 to travel through the heat sinks 13 as indicated by arrows of FIG. 5. Heat generated by the electronic device 3 are evenly transferred to both heat sinks 13 through the contact pad 11 as indicated by arrows and then removed by means of forced convection caused by the air streams.

Figure 6:
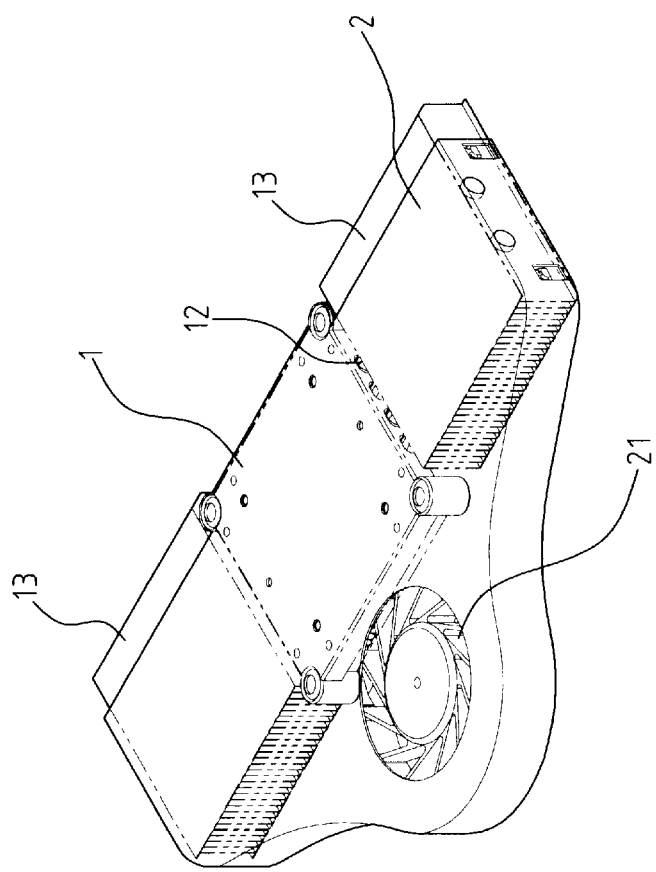
FIG. 6 is a perspective view of a heat dissipation device constructed in accordance with a third embodiment of the present invention.

FIG. 6 shows a heat dissipation device constructed in accordance with a third embodiment of the present invention which is a modification of the second embodiment wherein only one single fan 21 is included to generate the air streams toward both heat sinks 13.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A heat dissipation device comprising a contact pad made of heat conductive material, a plurality of heat pipes and at least two heat sinks, the heat pipes being in physical engagement with the contact pad aid extending from sides of the contact pad to thermally couple to the heat sinks, a fan assembly being provided in correspondence to the heat sinks, wherein the beat sinks are coupled to a too shell of the fan assembly by spring-biased fasteners, the fan assembly comprising at least one fan mounted within the top shell.

2. The heat dissipation device as claimed in claim 1, wherein the contact pad comprises a base board and a cover board, the cover board defining channels for accommodating the heat pipes therein.

3. The heat dissipation device as claimed in claim 1, where the two heat sinks are arranged on opposite sides of the contact pad.

4. The heat dissipation device as claimed in claim 1, wherein the two heat sinks are arranged on adjacent sides of the contact pad.

5. The heat dissipation device as claimed in claim 1, comprising three heat sinks respectively arranged on three sides of the contact pad.

6. The heat dissipation device as claimed in claim 1, wherein the fan assembly comprises a fan associated with each heat sink.

7. The heat dissipation device as claimed in claim 1, further comprises a bottom shell for securing each heat sink.

8. The heat dissipation device as claimed in claim 1, wherein the contact pad is made of copper-based alloy.

9. A heat dissipation device comprising a contact pad made of heat conductive material, at least two heat sinks, a plurality of heat pipes being in physical engagement with the contact pad and extending from sides of the contact pad to thermally couple to the heat sinks, and an air stream generation unit having a plurality of air passages each connecting a respective heat sink to at least one fan.

10. The heat dissipation device as claimed in claim 9, wherein the contact pad comprises a base board and a cover board, the cover board defining channels for accommodating the heat pipes therein.

11. The heat dissipation device as claimed in claim 9, where the two heat sinks are arranged on opposite sides of the contact pad.

12. The heat dissipation device as claimed in claim 9, wherein the two heat sinks are arranged on adjacent sides of the contact pad.

13. The heat dissipation device as claimed in claim 9, comprising three heat sinks respectively arranged on three sides of the contact pad.

14. The heat dissipation device as claimed in claim 9, wherein the air stream generation unit comprises a plurality of fans each being associated with a heat sink.

15. The heat dissipation device as claimed in claim 9, wherein the air stream generation unit comprises only one fan and each heat sink has an air passage to the fan.

16. The heat dissipation device as claimed in claim 9, wherein the heat sinks are coupled to a top shell of the air stream generation unit by spring-biased fasteners and at least one fan is mounted within the top shell.

17. The heat dissipation device as claimed in claim 9, further comprises a bottom shell for securing each heat sink.

18. The heat dissipation device as claimed in claim 9, wherein the contact pad is made of copper-based alloy.

19. The heat dissipation device as claimed in claim 9, wherein the contact pad, the heat sinks and the air stream generation unit are connected substantially on a same plane to form an integral heat dissipation device.

* * * * *